(12) United States Patent
Campbell

(10) Patent No.: US 7,338,851 B2
(45) Date of Patent: Mar. 4, 2008

(54) DIODE/SUPERIONIC CONDUCTOR/POLYMER MEMORY STRUCTURE

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 10/890,181

(22) Filed: Jul. 14, 2004

(65) Prior Publication Data

US 2004/0262591 A1 Dec. 30, 2004

Related U.S. Application Data

(62) Division of application No. 10/452,637, filed on Jun. 3, 2003, now Pat. No. 6,921,912.

(51) Int. Cl.
    *H01L 21/8244* (2006.01)
(52) U.S. Cl. .................. 438/238; 438/95; 438/381; 257/E31.029
(58) Field of Classification Search ............... 438/3, 438/95, 238–256, 381, 390–399; 257/E31.029
See application file for complete search history.

(56) References Cited

U.S. PATENT DOCUMENTS

| | | | |
|---|---|---|---|
| 4,544,797 A * | 10/1985 | Hewig | 136/249 |
| 5,324,963 A * | 6/1994 | Kamata | 257/96 |
| 5,825,046 A * | 10/1998 | Czubatyj et al. | 257/2 |
| 5,841,150 A | 11/1998 | Gonzalez et al. | |
| 6,236,059 B1 | 5/2001 | Wolstenholme et al. | |
| 6,376,284 B1 | 4/2002 | Gonzalez et al. | |
| 6,768,157 B2 | 7/2004 | Krieger et al. | |
| 6,806,526 B2 | 10/2004 | Krieger et al. | |
| 6,815,286 B2 | 11/2004 | Krieger et al. | |
| 6,870,183 B2 * | 3/2005 | Tripsas et al. | 257/40 |
| 2002/0163828 A1 | 11/2002 | Krieger et al. | |
| 2002/0163831 A1 | 11/2002 | Krieger et al. | |
| 2003/0053350 A1 | 3/2003 | Krieger et al. | |
| 2003/0155602 A1 * | 8/2003 | Krieger et al. | 257/306 |
| 2003/0173612 A1 * | 9/2003 | Krieger et al. | 257/304 |
| 2004/0026714 A1 | 2/2004 | Krieger et al. | |
| 2004/0108501 A1 | 6/2004 | Cheung et al. | |
| 2004/0159835 A1 | 8/2004 | Krieger et al. | |
| 2004/0245517 A1 | 12/2004 | Campbell | |
| 2004/0246768 A1 | 12/2004 | Krieger et al. | |
| 2004/0262591 A1 | 12/2004 | Campbell | |

* cited by examiner

*Primary Examiner*—H. Jey Tsai
(74) *Attorney, Agent, or Firm*—Dickstein Shapiro LLP

(57) ABSTRACT

A conjugated polymer layer with a built-in diode is formed by providing a first metal-chalcogenide layer over a bottom electrode. Subsequently, a second metal-chalcogenide layer is provided over and in contact with the first metal-chalcogenide layer. The first metal-chalcogenide layer has a first conductivity type and the second metal-chalcogenide layer has a second conductivity type. The plane of contact between the first and second metal-chalcogenide layers creates the p-n junction of the built-in diode. Then a polymer layer is selectively deposited on the second metal-chalcogenide layer. The second metal-chalcogenide layer provides ions to the polymer layer to change its resistivity. A top electrode is then provided over the polymer layer. An exemplary memory cell may have the following stacked structure: first electrode/n-type semiconductor/p-type semiconductor/conjugated polymer/second electrode.

6 Claims, 10 Drawing Sheets

DIODE/SUPERIONIC CONDUCTOR/POLYMER MEMORY STRUCTURE

CROSS-REFERENCE TO RELATED APPLICATION

The present application is a divisional application of U.S. patent application Ser. No. 10/452,637, filed on Jun. 3, 2003, now U.S. Pat. No. 6,921,912 the disclosure of which is incorporated herein by reference.

FIELD OF THE INVENTION

The invention relates to the field of conjugated polymer memory structures containing superionic conductor material, and in particular to a memory cell which incorporates a diode directly in the memory element of a conjugated polymer memory cell.

BACKGROUND OF THE INVENTION

A diode array may be used in semiconductor memory devices. The individual diodes in a given array are typically addressed via bit and word line selection. Resistance of a programmable resistor in series with the selected diode is controlled to select a desired memory state. The presence of a diode improves the switching properties of a programmable resistor by creating a threshold voltage which must be overcome before the memory state can be changed.

One possibility for a programmable resistor is a polymer element in a polymer memory cell. Polymer memory stores data based on the polymer's electrical resistance, rather than encoding zeroes and ones as the amount of charge stored in a cell. A polymer memory cell may have a polymer sandwiched between two electrodes. Application of an electric field to a cell lowers the polymer's resistance, thus increasing its ability to conduct current. The polymer maintains its state until a field of opposite polarity is applied to raise its resistance back to the original level. The different conductivity states represent bits of information. A conjugated polymer memory cell may also have a superionic conductor material layer to supply ions to the polymer and change its state from a high resistance to a low resistance.

Japanese Patent Application Nos. 2000-334686 and JP 2001-138103 describe a point contact array, NOT circuit and electronic circuit with $Ag_2Se/Cu_2Se$ interfaces between electrodes to reversibly control the conductance between electrodes. Japanese Patent Application No. 2000-265344 refers to an electronic device including a first electrode made of a conductor material having ionic conductors and electron conductors and a second electrode made of a conductive material. A voltage is applied between the first and second electrodes such that the first electrode is negative with respect to the second electrode so that mobile ions move from the first electrode to the second electrode to form a bridge between the electrodes.

SUMMARY OF THE INVENTION

The invention relates to a conjugated polymer memory structure which includes a diode directly at the superionic conductor interface. This is achieved in one embodiment by providing a first metal-chalcogenide of a first conductive type (n-type semiconductor) over a bottom electrode and a second metal-chalcogenide of a second conductive type (p-type semiconductor) in direct contact with the first metal-chalcogenide and beneath the conjugated polymer layer and top electrode. Thus, a simplified, functional memory cell with a built-in diode would have the following structure: bottom electrode/n-type semiconductor/p-type semiconductor/conjugated polymer/top electrode. These and other features and advantages of the invention will be better understood from the following detailed description, which is provided in connection with the accompanying drawings.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" used in the following description may include any supporting structure including but not limited to a glass, plastic, or semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures which may not be silicon-based. When reference is made to a semiconductor substrate in the following description, previous process steps may have been utilized to form regions or junctions in and/or over the base semiconductor or foundation.

The term "metal" is intended to include not only the elemental metal employed, but the elemental metal with other trace metals or in various alloyed combinations with other metals as is known in the semiconductor industry, as long as such metal alloy is conductive, and as long as the physical and electrical properties of the elemental metal remain unchanged.

Figure 1:
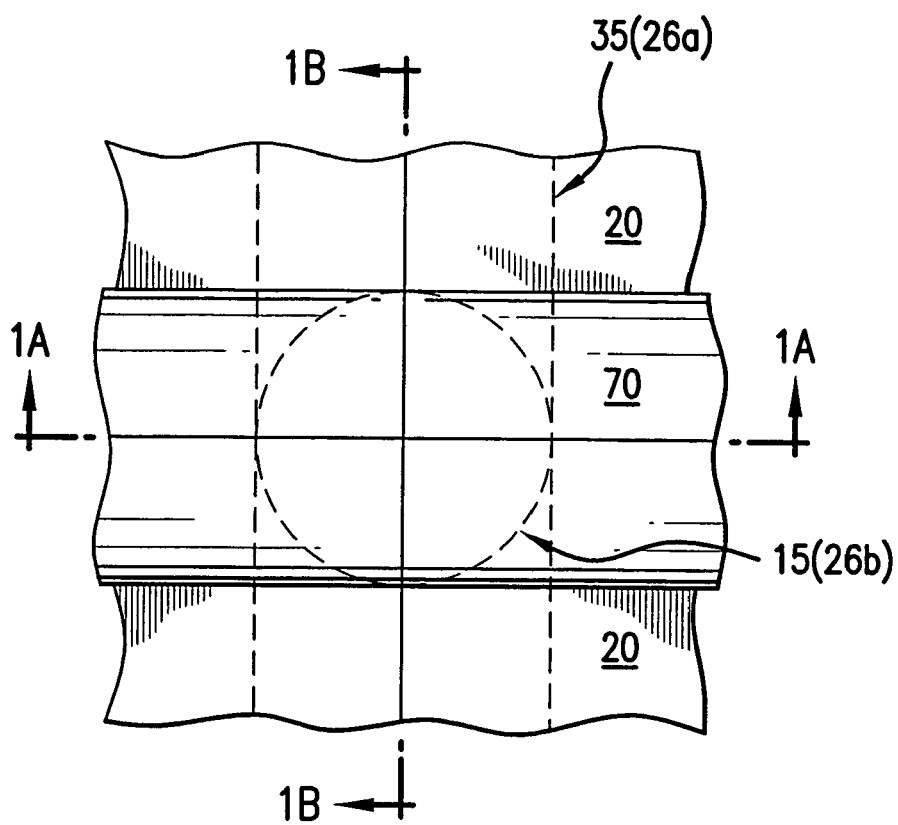
FIG. 1 is a plan view of a memory cell constructed in accordance with the present invention.

Referring now to the drawings where like elements are designated by like reference numerals, there is shown in FIG. 1 a memory cell 15 constructed in accordance with the present invention. The memory cell 15 has a substrate 10 and two insulating layers 20 and 22. There are openings 26a and 26b in the insulating layers 22 and 20, respectively. The opening 26a is a trench in insulating layer 22 and contains a bottom conductive electrode layer 35. The opening 26b is a hole in insulating layer 20 and contains a first metal-chalcogenide layer 45 and a second metal-chalcogenide layer 55. The first metal-chalcogenide layer 45 is located over the conductive electrode layer 35. The insulating layers 20 and 22 are preferably $Si_3N_4$ to prevent migration of metals through the insulating layers 20 and 22.

Figure 1A:
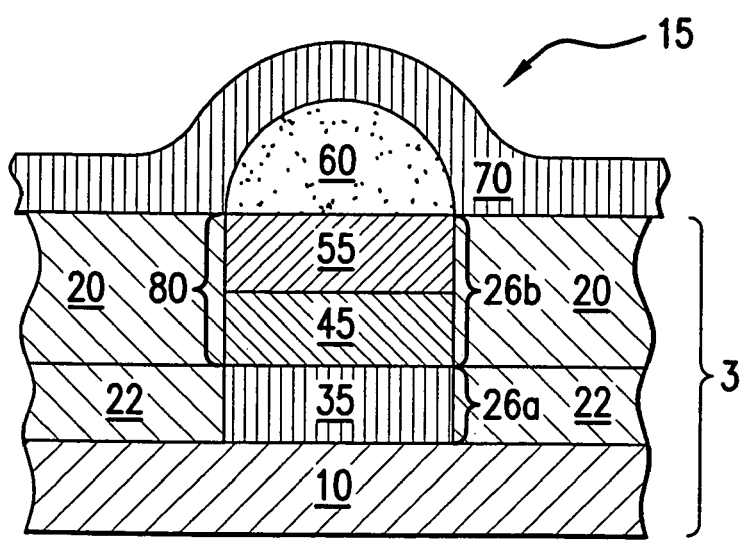
FIG. 1A is a cross-section of the memory cell of FIG. 1, taken along line 1A-1A.
Figure 1B:
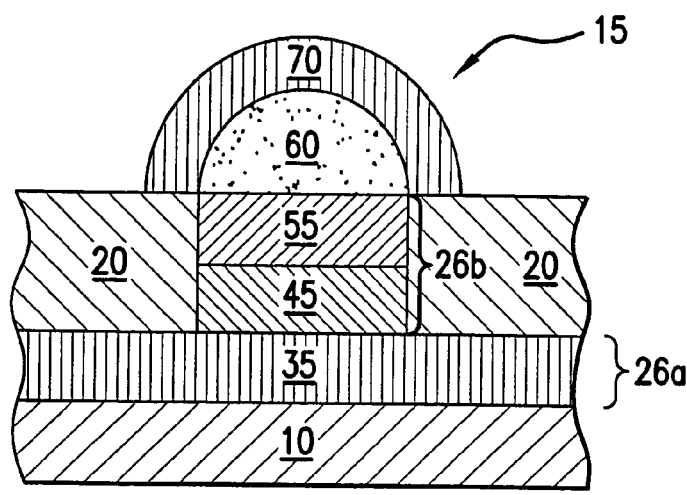
FIG. 1B is a cross-section of the memory cell of FIG. 1, taken along line 1B-1B.
Figure 1C:
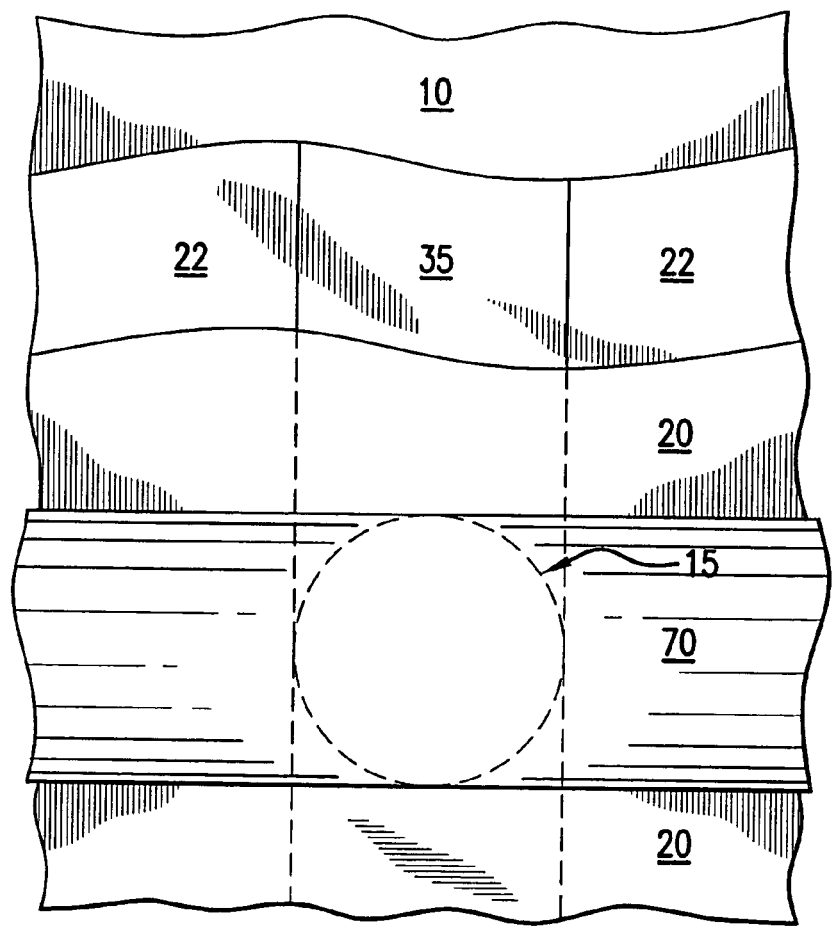
FIG. 1C is a plan view of the memory cell of FIG. 1 cut back at two levels.

The first metal-chalcogenide layer 45 has a first conductivity type. The second metal-chalcogenide layer 55 is located over the first metal-chalcogenide layer 45. The second metal-chalcogenide layer 55 has a second conductivity type. The top of the second metal-chalcogenide layer 55 is flush with the top surface of the insulating layer 20. A polymer layer 60 is located over the second metal-chalcogenide layer 55. A top electrode 70 is located over the polymer layer 60 and insulating layer 20. FIG. 1C shows in plan view the memory cell 15 with two levels cut back to reveal the substrate 10 at one level and the bottom electrode layer 35 in the insulating layer 22 at another level. The top electrode 70 runs perpendicularly to the bottom electrode layer 35.

In operation, the memory cell 15 stores data based on the resistivity of the conjugated polymer layer 60. The resistivity of the conjugated polymer layer 60 changes from a high resistance to a low resistance when ions are donated from the second metal-chalcogenide layer 55.

The combination of first metal-chalcogenide layer 45 of a first conductivity in contact with second metal-chalcogenide layer 55 of a second conductivity creates a diode 80 (FIG. 1A) built into the memory cell 15. The diode 80 operates the memory cell 15 by creating a threshold voltage at which the resistivity of the conjugated polymer layer 60 will change. Building the diode 80 into the memory cell 15, instead of providing a separate component connected in series with the memory cell, improves the switching properties of the memory cell 15, while maintaining a relatively small structure.

The bottom conductive electrode layer 35 may comprise, for example, a metal such as Al or Ti, an oxide compound, such as indium-tin-oxide (TIP), or copper, or a semiconductor or a conducting polymer. Al and Ti may be preferred over Cu for certain products, where the Cu may tend to diffuse through an Ag-rich layer to a $Cu_2Se$ or $Cu_2S$ layer (to be described below), which could affect the operation of the memory device. Other suitable conductive materials which cannot diffuse through the Ag-rich layer and affect the mechanism of the device may also be used.

The first metal-chalcogenide layer 45 may comprise an n-type semiconductor such as $Ag_2Se$ or $Ag_2S$. The $Ag_2Se$ or $Ag_2S$ may be provided in a superionic conductor phase or in an n-type semiconductor phase.

The second metal-chalcogenide layer 55 may comprise a p-type semiconductor such as $Cu_2Se$ or $Cu_2S$ in a p-type semiconductor phase or in a superionic conductor phase. If the first metal-chalcogenide layer 45 comprises $Ag_2Se$, then the second metal-chalcogenide layer 55 preferably comprises $Cu_2Se$. If the first metal-chalcogenide layer 45 comprises $Ag_2S$, then the second metal-chalcogenide layer 55 preferably comprises $Cu_2S$.

Even when the metal-chalcogenide layers are provided in their semiconductor phases, they possess superionic properties. The high temperatures at which they are deposited (above the phase transition temperature of the material) change the material properties entirely to the superionic conducting phase. Although the materials return to a semiconductor phase when the temperature is lowered, they still retain some superionic defects, making them capable of donating ions to the conjugated polymer layer 60.

The polymer layer 60 may comprise materials such as polymethylphenylacetylene, copperphtalocyanine, polyparaphenylene, polyphenylenevinylene, polyaniline, polythiophene and polypyrrole. Other suitable conjugated polymer materials that adhere to the copper content of the second metal-chalcogenide layer 55 may be used as well. In a preferred embodiment of the invention, the material of the polymer layer 60 adheres only, or at least preferentially, to the material of the second superionic conductor layer 55.

Figure 2:
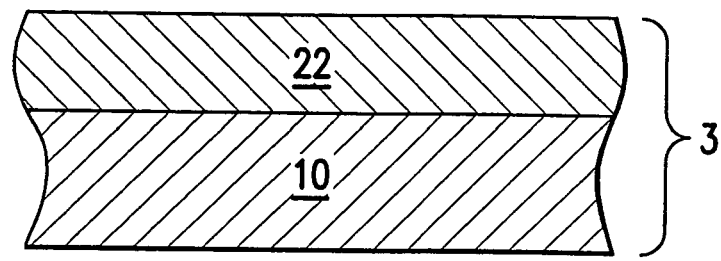
FIG. 2 illustrates a preform for the memory cell of FIG. 1 at an initial stage of fabrication.
Figure 2A:
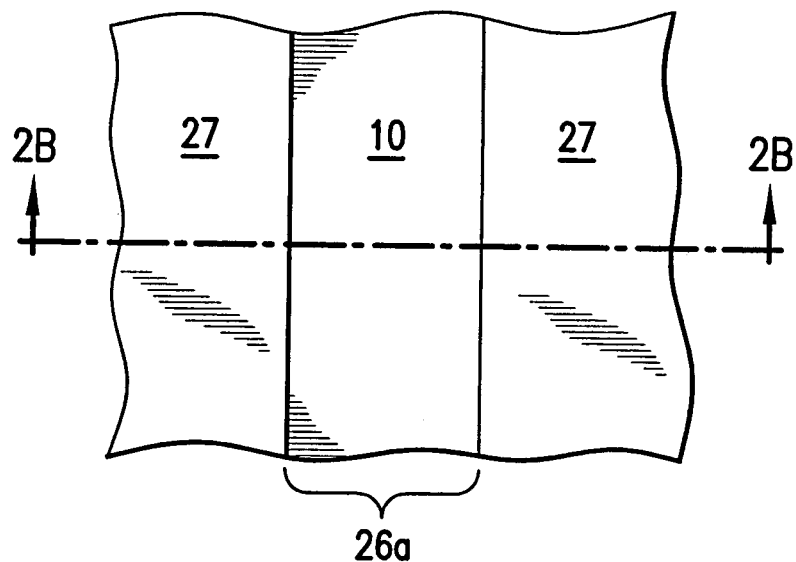
FIG. 2A is a plan view of the memory cell preform of FIG. 2 at a subsequent stage of fabrication.
Figure 2B:
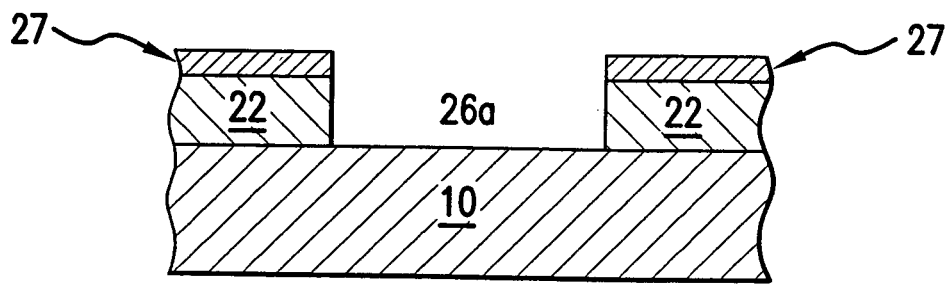
FIG. 2B is a cross-section of the memory cell preform of FIG. 2A, taken along line 2B-2B.

FIG. 2 illustrates a cross-sectional view of a memory cell preform 3 at an initial stage of fabrication. A first insulating layer 22 is deposited over the substrate 10. As shown in FIGS. 2A and 2B, a masking layer 27 is deposited in a trench pattern over the insulating layer 22 and etched to form the trench opening 26a. The masking layer 27 is then removed.

Figure 3:
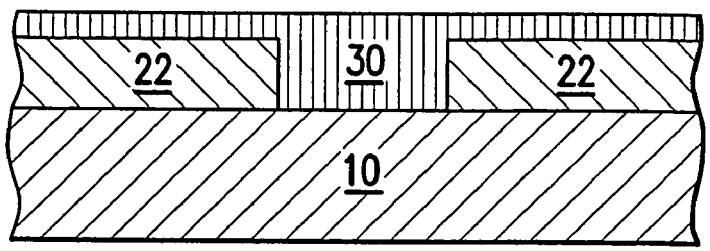
FIG. 3 illustrates the memory cell preform of FIG. 2A at a subsequent stage of fabrication.
Figure 4:
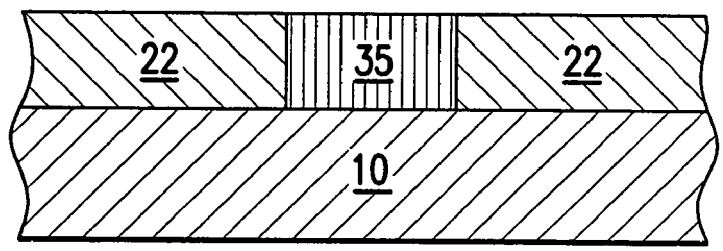
FIG. 4 illustrates the memory cell preform of FIG. 3 at a subsequent stage of fabrication.

As shown in FIG. 3, at a subsequent stage of fabrication, conductive material 30 is deposited in the opening 26a. As discussed above, the conductive material 30 may be, for example, a metal such as Al or Ti, an oxide compound, such as indium-tin-oxide (ITO), or copper, or a semiconductor or a conducting polymer. The conductive material 30 is etched or planarized to produce a conductive electrode layer 35 in the trench opening 26a as shown in FIG. 4.

Figure 5:
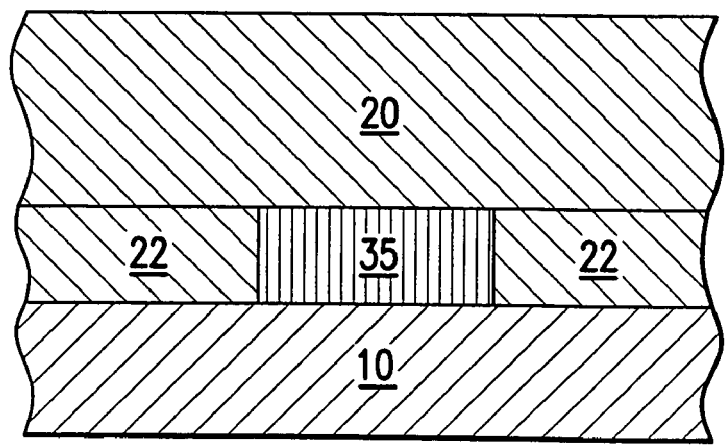
FIG. 5 illustrates the memory cell preform of FIG. 4 at a subsequent stage of fabrication.
Figure 5A:
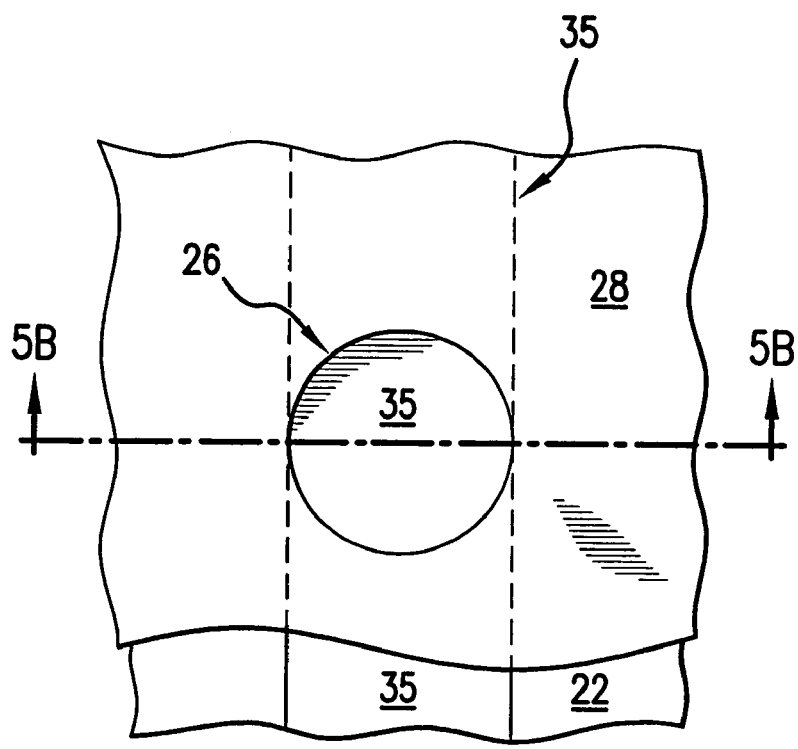
FIG. 5A is a plan view of the memory cell preform of FIG. 5 at a subsequent stage of fabrication, cut back at one level.
Figure 5B:
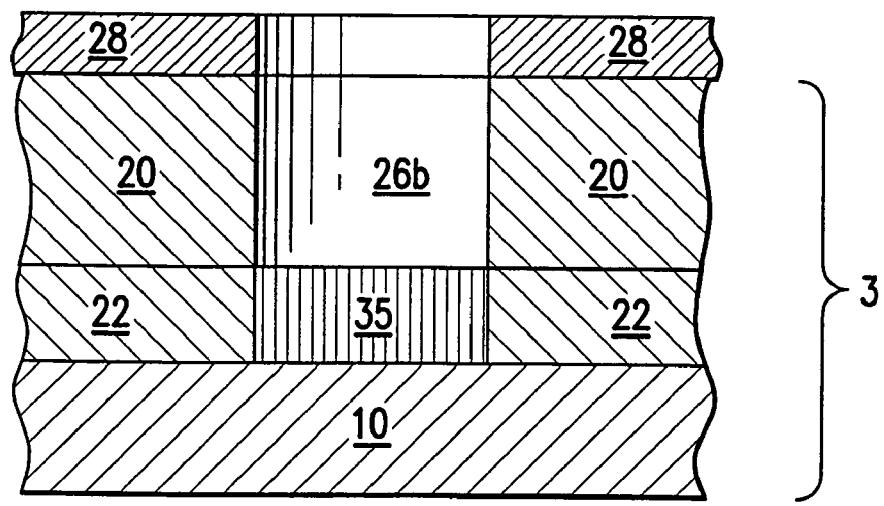
FIG. 5B is a cross-section of the memory cell preform of FIG. 5A, taken along line 5B-5B.

FIG. 5 illustrates a cross-sectional view of a memory cell preform 3 at a subsequent stage of fabrication. A second insulating layer 20 is deposited over the first insulating layer 22 and conductive electrode layer 35. As shown in FIGS. 5A and 5B, a masking layer 28 is deposited in a hole-shaped pattern over the insulating layer 20 and etched to form the hole-shaped opening 26b. The masking layer 28 is then removed.

Figure 6:
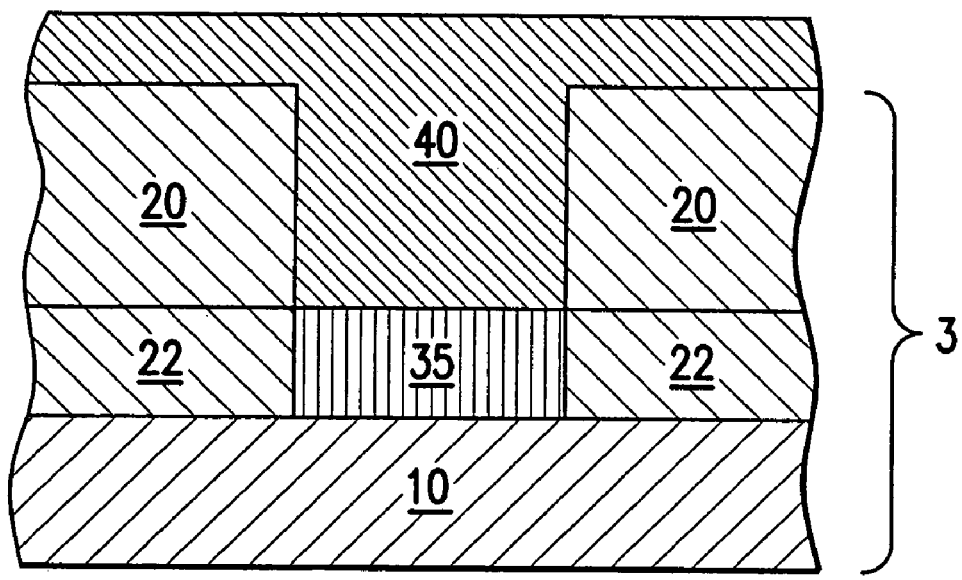
FIG. 6 illustrates the memory cell preform of FIG. 5 at a subsequent stage of fabrication.
Figure 7:
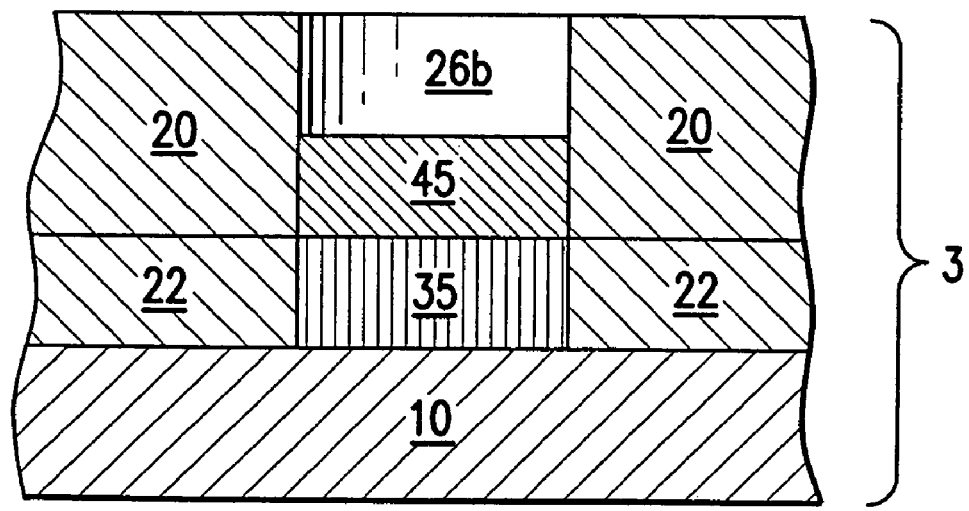
FIG. 7 illustrates the memory cell preform of FIG. 6 at a subsequent stage of fabrication.

Subsequently, the first metal-chalcogenide material 40 (FIG. 6) is deposited in the opening 26b. The first metal-chalcogenide material 40 is preferably an n-type semiconductor such as $Ag_2Se$ or $Ag_2S$. The $Ag_2Se$ or $Ag_2S$ may be provided in an n-type semiconductor phase or in a superionic conductor phase. First metal-chalcogenide material 40 may be formed by known methods such as sputtering. The first metal-chalcogenide material 40 is etched to produce a first metal-chalcogenide layer 45 (FIG. 7) in the bottom of opening 26b, over and in contact with the conductive electrode layer 35.

Figure 8:
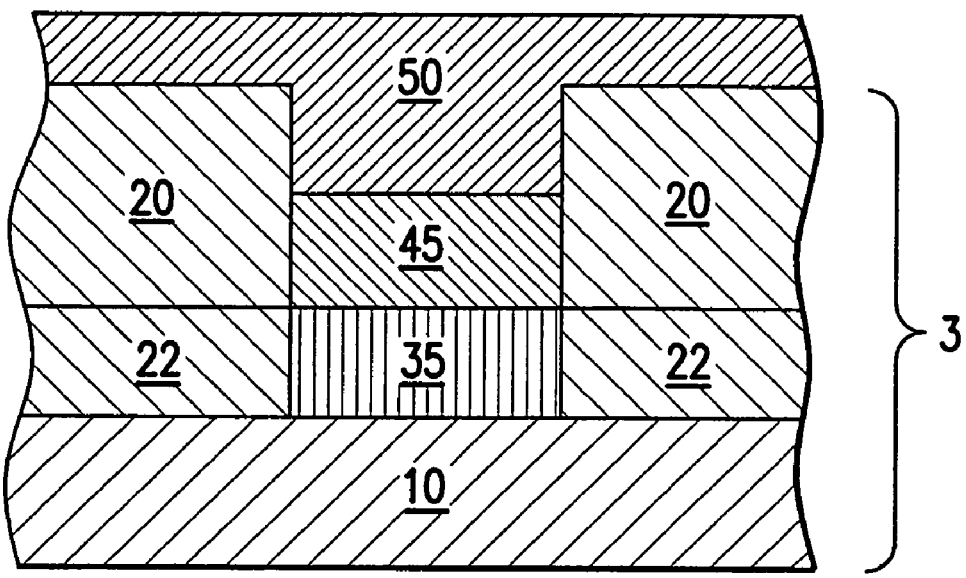
FIG. 8 illustrates the memory cell preform of FIG. 7 at a subsequent stage of fabrication.
Figure 9:
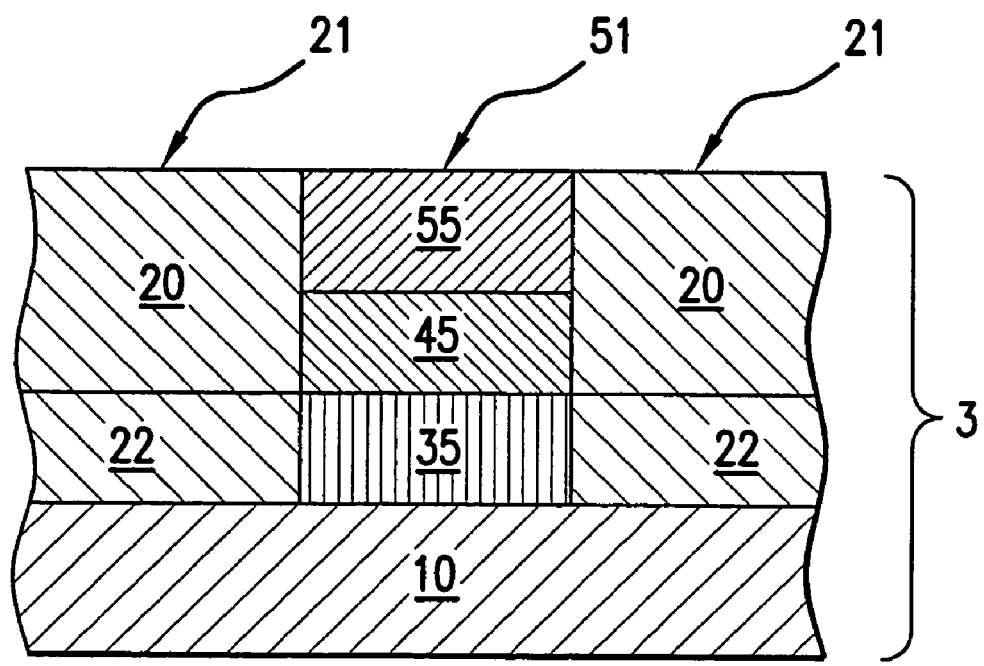
FIG. 9 illustrates the memory cell preform of FIG. 8 at a subsequent stage of fabrication.

The second metal-chalcogenide material 50 (FIG. 8) is then deposited in the opening 26b. As discussed above, the second metal-chalcogenide material 50 is preferably a p-type semiconductor such as $Cu_2Se$ or $Cu_2S$ in a p-type semiconductor phase or in a superionic conductor phase. If $Ag_2Se$ is used as the first metal-chalcogenide material 40, then it is preferable to use $Cu_2Se$ as the second metal-chalcogenide material 50. If $Ag_2S$ is used as the first metal-chalcogenide material 40, then it is preferable to use $Cu_2S$ as the second metal-chalcogenide material 50. Second metal-chalcogenide material 50 may be formed by known methods such as sputtering. The second metal-chalcogenide material 50 is then etched to produce a second metal-chalcogenide layer 55 (FIG. 9) in the bottom of opening 26b, over and in contact with first metal-chalcogenide layer 45. The top of second metal-chalcogenide layer 51 is at the same level as the top of insulating layer 21.

Figure 10:
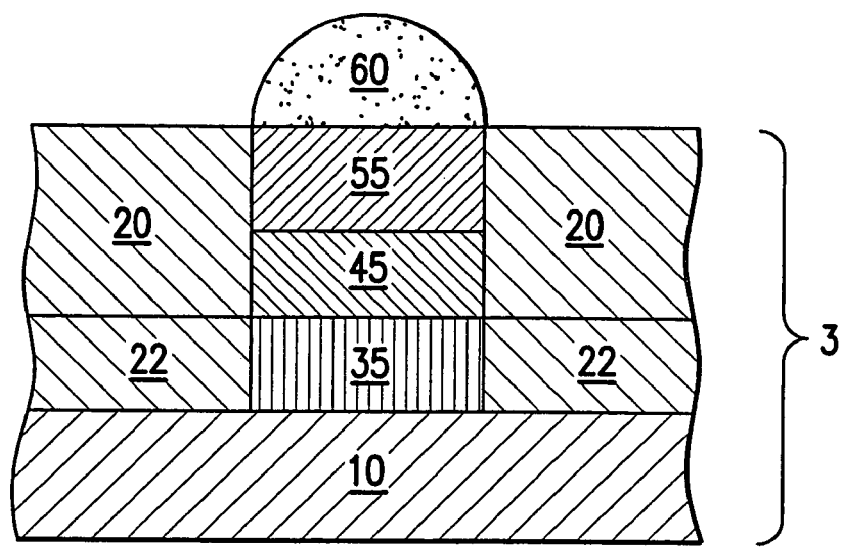
FIG. 10 illustrates the memory cell preform of FIG. 9 at a subsequent stage of fabrication.

A conjugated polymer material is then selectively deposited over the second metal-chalcogenide layer 55 to form a polymer layer 60 (FIG. 10). As discussed above, the second metal-chalcogenide layer 55 acts as an adhesion layer so that the polymer layer 60 to be deposited thereon will adhere to it. The copper content of the second metal-chalcogenide layer 55 is suitable to serve as an adhesion layer for a number of different polymer materials, such as polymethylphenylacetylene, or copperphtalocyanine. Other conjugated polymer materials such as such as polyparaphenylene, polyphenylenevinylene, polyaniline, polythiophene and polypyrrole may also be deposited.

In order to selectively deposit the conjugated polymer material over the second metal-chalcogenide layer 55, the memory cell preform 3 is located in a relatively large chamber where a relatively small volume of liquid monomer is provided (not shown). A monomer gas is also provided with the large volume. The memory cell preform 3 is held in this chamber for a period of time and maintained at a desired temperature range. The period of time and temperature range may vary depending on the particular materials used. The polymerization creates a polymeric film of the conjugated polymer material that takes place at the monomer gas-solid interface. The type of conjugated polymer material that will polymerize over the surface of the second metal-chalcogenide layer 55 is dependant on the type of monomer gas used.

FIG. 1 is a plan view of the memory cell preform 3 of FIG. 10 at a final stage of fabrication. As shown in FIGS. 1A and 1B, a conductive material is deposited over the top surface of polymer layer 60 to form a top electrode 70.

Figure 11:
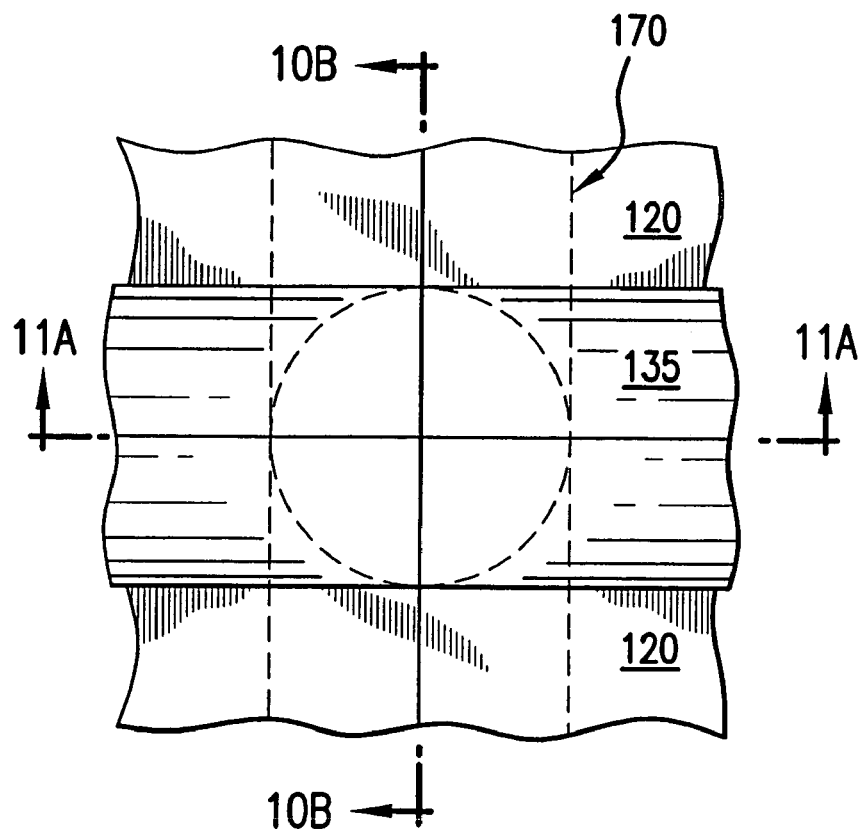
FIG. 11 is a plan view of another embodiment of the present invention.
Figure 11A:
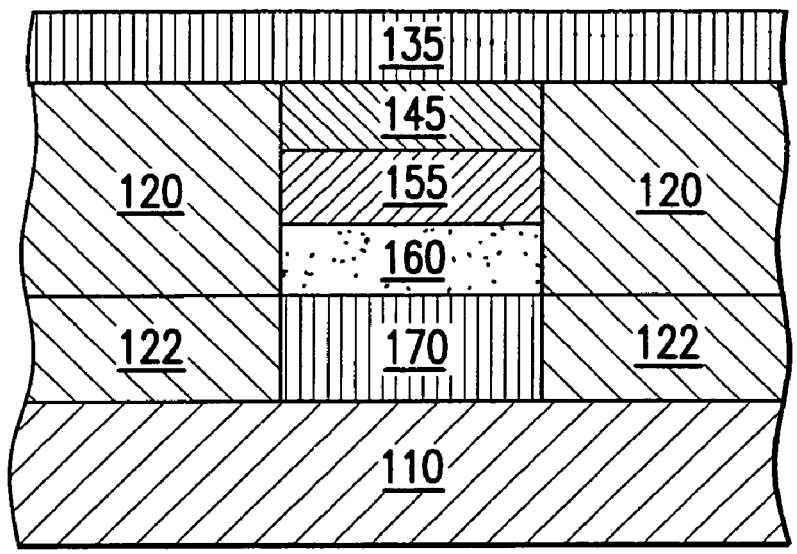
FIG. 11A is a cross-section of the embodiment of FIG. 11, taken along line 11A-11A.
Figure 11B:
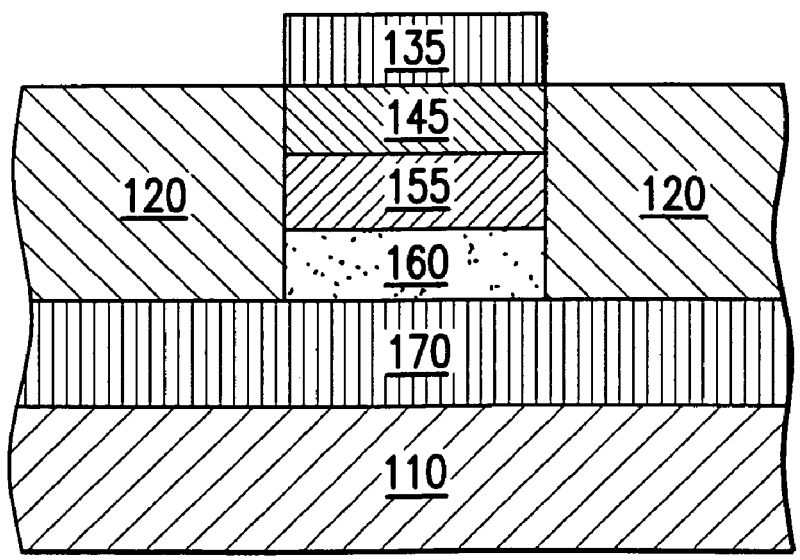
FIG. 11B is a cross section of the embodiment of FIG. 11, taken along line 11B-11B.

In another embodiment of the invention, the layers may be deposited in a reverse order, as shown in FIG. 11. As shown in FIGS. 1A and 1B, a bottom electrode 170 lies in a trench in a first insulating layer. A polymer layer 160, a first metal-chalcogenide layer 155, and a second metal-chalcogenide layer 145 are formed in a hole in a second insulating layer 120 over the bottom electrode 170 and the first insulating layer 122. The first metal-chalcogenide layer 155 is deposited over and in contact with the polymer layer 160. First metal-chalcogenide layer 155 is preferably a p-type semiconductor such as $Cu_2Se$ or $Cu_2S$ in a superionic conductor phase. The second metal-chalcogenide layer 145 is deposited over and in contact with the first metal-chalcogenide layer 155 and is preferably an n-type semiconductor such as $Ag_2Se$ or $Ag_2S$. If $Cu_2Se$ is used as the p-type semiconductor, then $Ag_2Se$ is preferably used as the n-type semiconductor. If $Cu_2S$ is used as the p-type semiconductor, then $Ag_2S$ is preferably used as the n-type semiconductor. The $Ag_2Se$ or $Ag_2S$ may be provided in an n-type semiconductor phase or in a superionic conductor phase.

A top electrode 135 is patterned over and in contact with the second metal-chalcogenide layer 145 such that it runs perpendicularly to the bottom electrode 170. The top electrode 130 is a conductive material and may be, for example, a metal such as Al or Ti, an oxide compound, such as indium-tin-oxide (ITO), a semiconductor or a conducting polymer. As described above, Cu may tend to diffuse through an Ag-rich layer to a $Cu_2Se$ or $Cu_2S$ layer, which could affect the operation of the memory device. Thus, Al and Ti may be preferred over Cu for certain products. Similarly, any other conductive material which cannot diffuse through the Ag-rich layer and affect the mechanism of the device is preferable.

Figure 12:
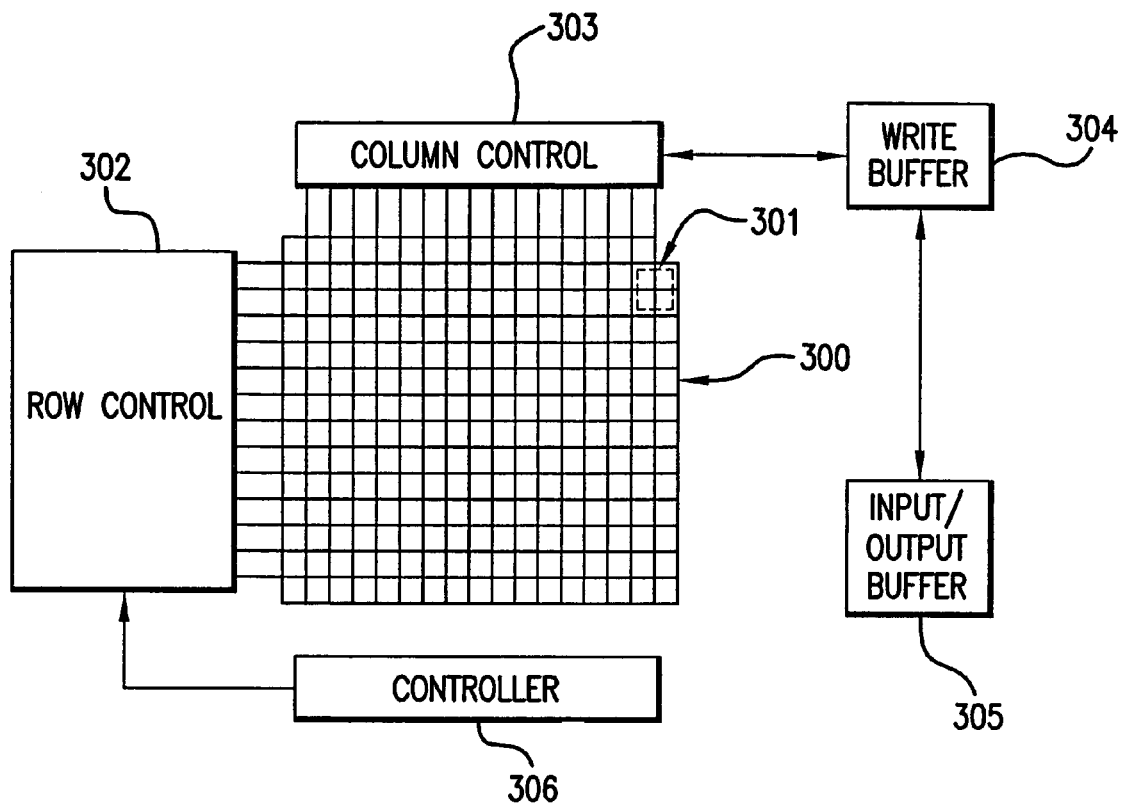
FIG. 12 is a block diagram of a memory device of the present invention.

FIG. 12 illustrates a memory device 300 of the present invention. The memory device 300 includes a plurality of memory blocks 301. Each block 301 includes one or more memory cells 15. The plurality of blocks 301 are coupled to a row control circuit 302 and a column control circuit 303, for addressing and controlling reading and writing of one or more memory cells 15 of a selected block 301. The column control circuit 303 is also coupled to a write buffer 304, which holds data to be written and to input/output buffers 305 for buffering off-device communications. A controller 306, coupled to the row control circuit 302, column control circuit 303, and input/output buffers 305, coordinates the activities of the device.

Figure 13:
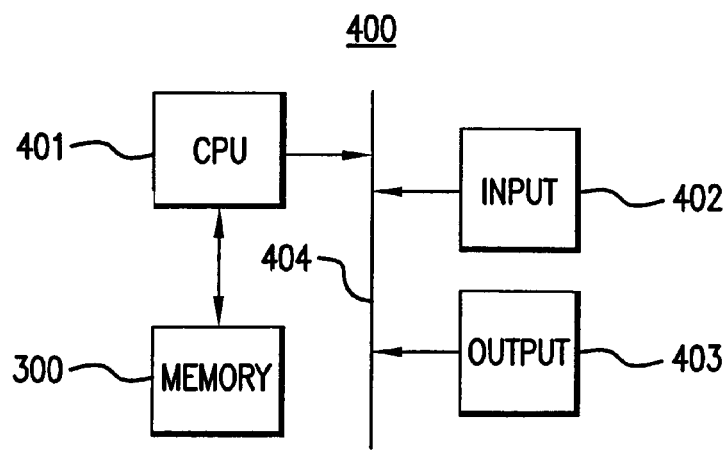
FIG. 13 is a schematic diagram of processing system employing a memory device of the present invention.

FIG. 13 illustrates a processing system 400 which may utilize the memory device 300 of the present invention. The processing system 400 includes one or more processors 401 coupled to a bus 404. The memory device 300 is controlled by the processor 401. Input device 402 and output device 403 are also coupled to the bus 404 to communicate with the processor 401.

The above description and drawings illustrate preferred embodiments which achieve the features and advantages of the present invention. It is not intended that the present invention be limited to the illustrated embodiments. Any modification of the present invention which comes within the spirit and scope of the following claims should be considered part of the present invention.

What is claimed is:

1. A method of forming a semiconductor device, comprising the steps of:

forming a first electrode;

forming a first metal-chalcogenide layer having a first conductivity type in contact with said first electrode;

forming a second metal-chalcogenide layer having a second conductivity type in contact with said first metal-chalcogenide layer;

forming a polymer memory element in contact with said second metal-chalcogenide layer, wherein said polymer memory element has a convex upper surface; and forming a second electrode in contact with said polymer memory element.

2. The method of claim 1, wherein said steps of forming said first metal-chalcogenide layer and forming said second metal-chalcogenide layer include sputtering and etching.

3. The method of claim 1, wherein said step of forming a polymer memory element includes depositing a material that adheres preferentially to the second metal-chalcogenide layer.

4. The method of claim 3, wherein said material is a conjugated polymer that changes resistance in response to an applied electric field.

5. The method of claim 4, wherein said conjugated polymer is selected from the group consisting of polymethylphenylacetylene, copperphtalocyanine, polyparaphenylene, polyphenylenevinylene, polyaniline, polythiophene and polypyrrole.

6. The method of claim 3, wherein the step of forming a polymer memory element includes locating said semiconductor device within an enclosed chamber with a liquid monomer.

* * * * *